United States Patent
Pavlov et al.

(10) Patent No.: US 8,234,537 B2
(45) Date of Patent: Jul. 31, 2012

(54) LAYERED DECODER AND METHOD FOR PERFORMING LAYERED DECODING

(75) Inventors: Dmitri Yurievich Pavlov, St. Petersburg (RU); Mikhail Yurievich Lyakh, St. Petersburg (RU)

(73) Assignee: Intel Corporation, Santa Clara, CO (US)

( * ) Notice: Subject to any disclaimer, the term of this patent is extended or adjusted under 35 U.S.C. 154(b) by 974 days.

(21) Appl. No.: 12/282,239

(22) PCT Filed: Mar. 31, 2006

(86) PCT No.: PCT/RU2006/000154
§ 371 (c)(1),
(2), (4) Date: Sep. 9, 2008

(87) PCT Pub. No.: WO2007/114724
PCT Pub. Date: Oct. 11, 2007

(65) Prior Publication Data
US 2009/0037791 A1 Feb. 5, 2009

(51) Int. Cl.
*H03M 13/00* (2006.01)
*H03M 13/03* (2006.01)

(52) U.S. Cl. ........ 714/752; 714/780; 714/786; 714/799; 714/804

(58) Field of Classification Search .................. 714/752, 714/780, 786, 799, 804
See application file for complete search history.

(56) References Cited

U.S. PATENT DOCUMENTS

| 7,706,457 | B2 * | 4/2010 | Waxman | 375/260 |
| 2004/0194007 | A1 | 9/2004 | Hocevar | |
| 2006/0015802 | A1 | 1/2006 | Hocevar | |
| 2007/0089019 | A1 * | 4/2007 | Tang et al. | 714/752 |
| 2008/0077843 | A1 * | 3/2008 | Cho et al. | 714/801 |

FOREIGN PATENT DOCUMENTS

| GB | 2449036 | 8/2011 |
| KR | 20050074621 A | 7/2005 |
| WO | WO-2007114724 A1 | 10/2007 |

OTHER PUBLICATIONS

Mansour rt al., High-Throughput LDPC Decoders, Dec. 2006, IEEE, vol. 11, No. 6, pp. 976-996.*

Hocevar, D. E, "A Reduced Complexity Decoder Architecture Via Layered Decoding of LDPC Codes", *Signal Processing Systems*, (Oct. 13, 2004), 107-112.

Mansour, M. M., "High-throughput LDPC decoders", *IEEE Transactions on Very Large Scale Integration (VLSI) Systems*, 11(6), (Dec. 2003), 976-996.

Radosavljevic, P., et al., "Optimized Message Passing Schedules for LDPC Decoding", *Conference Record of the thirty-Ninth Asilomar Conference on Pacific Grove.*, (Oct. 28, 2005), 591-595.

"British Application Serial No. 0815636.6, Office Action mailed Feb. 11, 2011", 3 pgs.

(Continued)

*Primary Examiner* — John J Tabone, Jr.
(74) *Attorney, Agent, or Firm* — Schwegman, Lundberg & Woessner, P.A.; Gregory J. Gorrie

(57) ABSTRACT

Embodiments of a decoder and method of decoding blocks of soft bits in a wireless receiver are generally described herein. Other embodiments may be described and claimed. In some embodiments, a memory is initialized with encoded input data and updated with sums of extrinsic reliabilities. Decoded output data is provided from the memory after a predetermined number of iterations.

31 Claims, 4 Drawing Sheets

OTHER PUBLICATIONS

"Korean Application Serial No. 2008-7024005, Office Action mailed Dec. 31, 2010", 3 pgs.

Hocevar, D. E, "A reduced complexity decoder architecture via layered decoding of LDPC codes", IEEE Workshop on Signal Processing Systems, 2004. SIPS 2004., (2004), 107-112.

"Korean Application Serial No. 2008-7024005, Final Office Action Response filed Apr. 11, 2011", 9 pgs.

"International Application Serial No. PCT/RU2006/000154, International Search Report mailed Jan. 22, 2007", 4 pgs.

"International Application Serial No. PCT/RU2006/000154, Written Opinion mailed", 6 pgs.

"Korean Application Serial No. 2008-7024005 , Final Office Action mailed Jun. 29, 2010", (English Translation), 2 pgs.

"British Application Serial No. 0815636.6, Response filed Apr. 11, 2011 to Office Action mailed Feb. 11, 2011", 2 pgs.

"Chinese Application Serial No. 200680054149.1, Non Final Office Action dated May 4, 2011", 38 pgs.

"Chinese Application Serial No. 200680054149.1, Office Action mailed Jan. 29, 2012", 28 pgs.

"Chinese Application Serial No. 200680054149.1, Response filed Sep. 18, 2011 to Office Action mailed May 4, 2011", 13 pgs.

"Korean Application Serial No. 2008-7024005, Final Office Action mailed Oct. 21, 2011", 4 pgs.

* cited by examiner

MULTICARRIER RECEIVER

LAYERED DECODER AND METHOD FOR PERFORMING LAYERED DECODING

This application is a U.S. National Stage Filing under 35 U.S.C. 371 from International Application No. PCT/RU2006/000154, filed Mar. 31, 2006 and published in English as WO 2007/114724 on Oct. 11, 2007, which application and publication is incorporated herein by reference in their entireties.

TECHNICAL FIELD

Some embodiments of the present invention pertain to communication systems that use forward error-correcting (FEC) techniques, including both wireless and wired communication systems. Some embodiments of the present invention pertain to data storage systems. Some embodiments pertain to decoders including low-density parity check (LDPC) decoders that perform layered decoding.

BACKGROUND

Communication systems employ various forms of FEC techniques to compensate for errors at the receiver. In wireless communication networks, at the transmitter, additional error-correcting bits, such as parity-check bits, may be added to each block of data prior to transmission. At the receiver, the additional bits are used by a decoder to help recover the original data bits that were transmitted. Some wireless systems use low-density parity check (LDPC) codes, which are linear block codes specified by a parity-check matrix. In some cases, LDPC encoding may provide a coding gain that is higher than some convolutional codes used by some wireless networks. Some systems use LDPC codes that can be decoded by layered LDPC decoding or turbo decoding with message passing for block-permutation LDPC codes. Layered decoding of LDPC codes may further improve coding gain of LDPC codes.

Layered decoding of LDPC coded signals is hardware and processing intensive, resulting in increased weight, size, complexity and/or power consumption. These can be significant drawbacks, especially for portable wireless communication devices.

Thus, there are general needs for decoders and methods for layered decoding of LDPC coded data that require less hardware and/or are less processing intensive, as well as decoders and methods for layered decoding of LDPC coded data that use less power. There are general needs for decoders and methods for layered decoding of LDPC coded data for wireless and wired communication systems, and decoders and methods for layered decoding of LDPC coded data in data storage systems.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
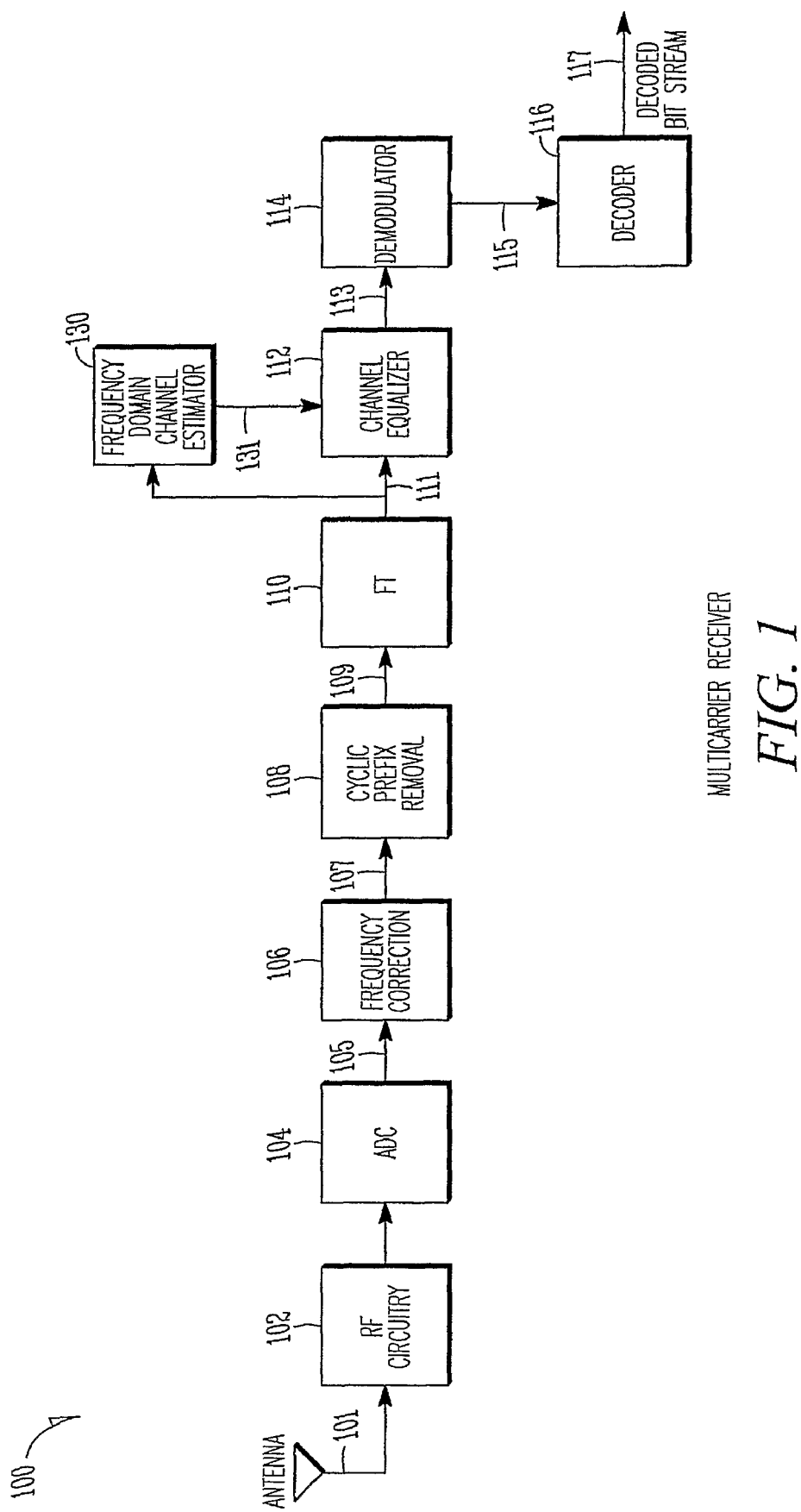
FIG. 1 is a block diagram of a multicarrier receiver in accordance with some embodiments of the present invention.

FIG. 1 is a block diagram of a multicarrier receiver in accordance with some embodiments of the present invention. Receiver 100 receives radio-frequency (RF) signals through antenna 101, processes the received signals, and generates decoded bit stream 117. Receiver 100 is illustrated in FIG. 1 as a multicarrier receiver which may receive and process multicarrier signals, such as orthogonal frequency division multiplexed (OFDM) signals and orthogonal frequency division multiple access (OFDMA) signals, however the scope of the invention is not limited in this respect.

Receiver 100 may include radio-frequency (RF) circuitry 102 to down-convert the received signals and analog-to-digital conversion (ADC) circuitry 104 to digitize the received signals and generate digital time-domain signals 105. Receiver 100 may also include frequency correction circuitry 106 to correct any frequency offset present in the received signals. In some embodiments, receiver 100 may also include cyclic prefix removal circuitry 108 to remove a cyclic prefix from frequency-corrected time-domain signals 107. Receiver 100 may also include Fourier-transform (FT) circuitry 110 to perform a Fourier transform on digital time-domain signals 109 to generate frequency-domain signals 111. In some embodiments, Fourier-transform circuitry 110 may provide a frequency-domain signal for each subcarrier of a received multicarrier communication signal. In some embodiments, Fourier-transform circuitry 110 may perform a discrete Fourier transform (DFT), such as a fast Fourier transform (FFT), although the scope of the invention is not limited in this respect.

Receiver 100 may also include frequency-domain channel estimator 130 to generate channel estimates 131 for individual subcarriers based on frequency-domain signals 111. In some embodiments, channel estimates 131 may comprise weights for each data subcarrier. Receiver 100 may also include channel equalizer 112 to weight the subcarriers of frequency-domain signals 111 based on channel estimates 131 to generate channel-equalized frequency-domain signals 113. In accordance with some embodiments, the application of the weights by channel equalizer 112 may help compensate for the effects of the communication channel through which the received signals may have propagated. In some embodiments, channel equalizer 112 may substantially cancel the effects of the communication channel. In some embodiments, channel-equalized frequency-domain signals 113 may comprise a symbol, such as a quadrature-amplitude modulated (QAM) symbol, for each data subcarrier, although the scope of the invention is not limited in this respect.

Receiver 100 may also include demodulator 114 to demodulate channel-equalized frequency-domain signals 113 and generate bit metrics 115 for each data subcarrier. In some embodiments, symbol demodulator 114 may be a QAM demodulator to demodulate QAM symbols. Receiver 100 may also include decoder 116 to perform an error-correction decoding operation on bit metrics 115 to generate decoded bit stream 117. In these embodiments, bit metrics 115 may represent probabilities (e.g., soft bits rather than actual hard bits), which may be decoded using a soft-decision decoding technique discussed in more detail below.

In some embodiments, decoder 116 may be a low-density parity check (LDPC) decoder that performs layered decoding. In some embodiments, a memory of decoder 116 is initialized with encoded input data and updated with sums of updated extrinsic reliabilities. Decoded output data is provided from the memory after a predetermined number of iterations. In some embodiments, a column-sum memory may be initialized with encoded input data and may be updated with sums of columns of updated extrinsic reliabilities for each layer of an LDPC code. The updated extrinsic reliabilities may be generated by processing differences between current data in the column-sum memory and a layer of the updated extrinsic reliabilities in a message memory. In these embodiments, decoder 116 may provide decoded output data corresponding to decoded bit stream 117 from the column-sum memory after a predetermined number of iterations. These embodiments of decoder 116 are discussed in more detail below.

In some embodiments, decoder 116 may perform LDPC layered decoding operations based on a parity-check matrix for a predetermined LDPC code. Some LDPC codes suitable for use by decoder 116 may include quasi-cyclic (QC) LDPC codes in which the parity check matrix comprises square submatrices that are either zero, unity, or cyclically-shifted unity matrices, although the scope of the invention is not limited in this respect.

In some embodiments, receiver 100 may also perform a deinterleaving operation prior to the operation of decoder 116. In some of these embodiments, the deinterleaving operation may be a block deinterleaving operation on blocks of hard bits or on blocks of bit metrics 115, although the scope of the invention is not limited in this respect. In some spread-spectrum embodiments, receiver 100 does not need to include cyclic-prefix removal circuitry 108, Fourier-transform circuitry 110, frequency-domain channel estimator 130 and channel equalizer 112.

Although FIG. 1 illustrates some embodiments of the present invention that are applicable to the communication of wireless multicarrier communication signals, embodiments of the present invention are applicable to the communication of almost any type of wireless and/or wired (e.g., wireline) communication signals including radio-frequency (RF) transmission and optical signal transmission. Some embodiments are applicable to spread spectrum signals including code-division multiple access (CDMA) and complementary code keying (CCK) signals. Some other embodiments of the present invention are applicable to data storage systems which use LDPC codes to store data. These embodiments are discussed in more detail below.

Although receiver 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of receiver 100 may refer to one or more processes operating on one or more processing elements.

In some embodiments, receiver 100 may be part of a wireless communication device that may communicate OFDM communication signals over a multicarrier communication channel. The multicarrier communication channel may be within a predetermined frequency spectrum and may comprise a plurality of orthogonal subcarriers. In some embodiments, the multicarrier signals may be defined by closely spaced OFDM subcarriers. Each subcarrier may have a null at substantially a center frequency of the other subcarriers and/or each subcarrier may have an integer number of cycles within a symbol period, although the scope of the invention is not limited in this respect. In some embodiments, receiver 100 may communicate in accordance with a multiple access technique, such as OFDMA, although the scope of the invention is not limited in this respect. In some embodiments, receiver 100 may be part of a wireless communication device that may communicate using spread-spectrum signals, although the scope of the invention is not limited in this respect.

In some embodiments, receiver 100 may be part of a communication station, such as a WLAN communication station including a Wireless Fidelity (WiFi) conmunnication station, an access point (AP), or a mobile station (MS). In some broadband wireless access (BWA) network embodiments, receiver 100 may be part of a BWA network communication station, such as a Worldwide Interoperability for Microwave Access (WiMax) communication station, although the scope of the invention is not limited in this respect as receiver 100 may be part of almost any wireless communication device. In some embodiments, receiver 100 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, the frequency spectrums for the communication signals received by receiver 100 may comprise either a 5 gigahertz (GHz) frequency spectrum or a 2.4 GHz frequency spectrum. In these embodiments, the 5 GHz frequency spectrum may include frequencies ranging from approximately 4.9 to 5.9 GHz, and the 2.4 GHz spectrum may include frequencies ranging from approximately 2.3 to 2.5 GHz, although the scope of the invention is not limited in this respect, as other frequency spectrums are also equally suitable. In some BWA network embodiments, the frequency spectrum for the communication signals may comprise frequencies between 2 and 11 GHz, although the scope of the invention is not limited in this respect.

In some embodiments, receiver 100 may receive signals in accordance with specific communication standards, such as the Institute of Electrical and Electronics Engineers (IEEE) standards including IEEE 802.11(a), 802.11(b), 802.11(g), 802.11(h), and/or 802.11(n) standards and/or proposed specifications for wireless local area networks, although the scope of the invention is not limited in this respect as they may also be suitable to transmit and/or receive communications in accordance with other techniques and standards. In some BWA network embodiments, receiver 100 may receive signals in accordance with the IEEE 802.16-2004 and the IEEE 802.16(e) standards for wireless metropolitan area networks (WMANs), including variations and evolutions thereof, although the scope of the invention is not limited in this respect as receiver 100 may also be suitable to transmit and/or receive communications in accordance with other techniques and standards. For more information with respect to the IEEE 802.11 and IEEE 802.16 standards, please refer to "IEEE Standards for Information Technology-Telecommunications and Information Exchange between Systems"—Local Area Networks—Specific Requirements—Part 11 "Wireless LAN Medium Access Control (MAC) and Physical Layer (PHY), ISO/IEC 8802-11: 1999," and Metropolitan Area Networks—Specific Requirements—Part 16: "Air Interface for Fixed Broadband Wireless Access Systems," May 2005 and related amendments/versions.

In some embodiments, receiver 100 may communicate in accordance with standards such as the Pan-European mobile system standard referred to as the Global System for Mobile Communications (GSM). Receiver 100 may also communicate in accordance with packet radio services such as the General Packet Radio Service (GPRS) packet data communication service. In some embodiments, receiver 100 may communicate in accordance with the Universal Mobile Telephone System (UMTS) for the next generation of GSM, which may, for example, implement communication techniques in accordance with 2.5 G and 3 G wireless standards (see 3GPP Technical Specification, Version 3.2.0, March 2000). In some of these embodiments, receiver 100 may provide packet data services (PDS) utilizing packet data protocols (PDP). In some embodiments, receiver 100 may communicate in accordance with other standards or other air-interfaces, including interfaces compatible with the enhanced data for GSM evolution (EDGE) standards (see 3GPP Technical Specification, Version 3.2.0, March 2000), although the scope of the invention is not limited in this respect.

In some multiple-input multiple-output (MIMO) embodiments, receiver 100 may further include two or more receive-signal paths. Each receive-signal path may have a separate antenna, RF circuitry, and ADC circuitry, among other things, although the scope of the invention is not limited in this respect. Antenna 101 may comprise one or more directional or omnidirectional antennas, including, for example, dipole antennas, monopole antennas, patch antennas, loop antennas, microstrip antennas, or other types of antennas suitable for reception of RF signals. In some MIMO embodiments, two or more antennas may be used. In some embodiments, instead of two or more antennas, a single antenna with multiple apertures may be used. In these embodiments, each aperture may be considered a separate antenna. In some embodiments, each antenna may be effectively separated to take advantage of spatial diversity and the different channel characteristics that may result between each of the antennas and a transmitting wireless communication device. In some embodiments, the antennas may be separated by up to 1/10 of a wavelength or more, although the scope of the invention is not limited in this respect.

Figure 2:
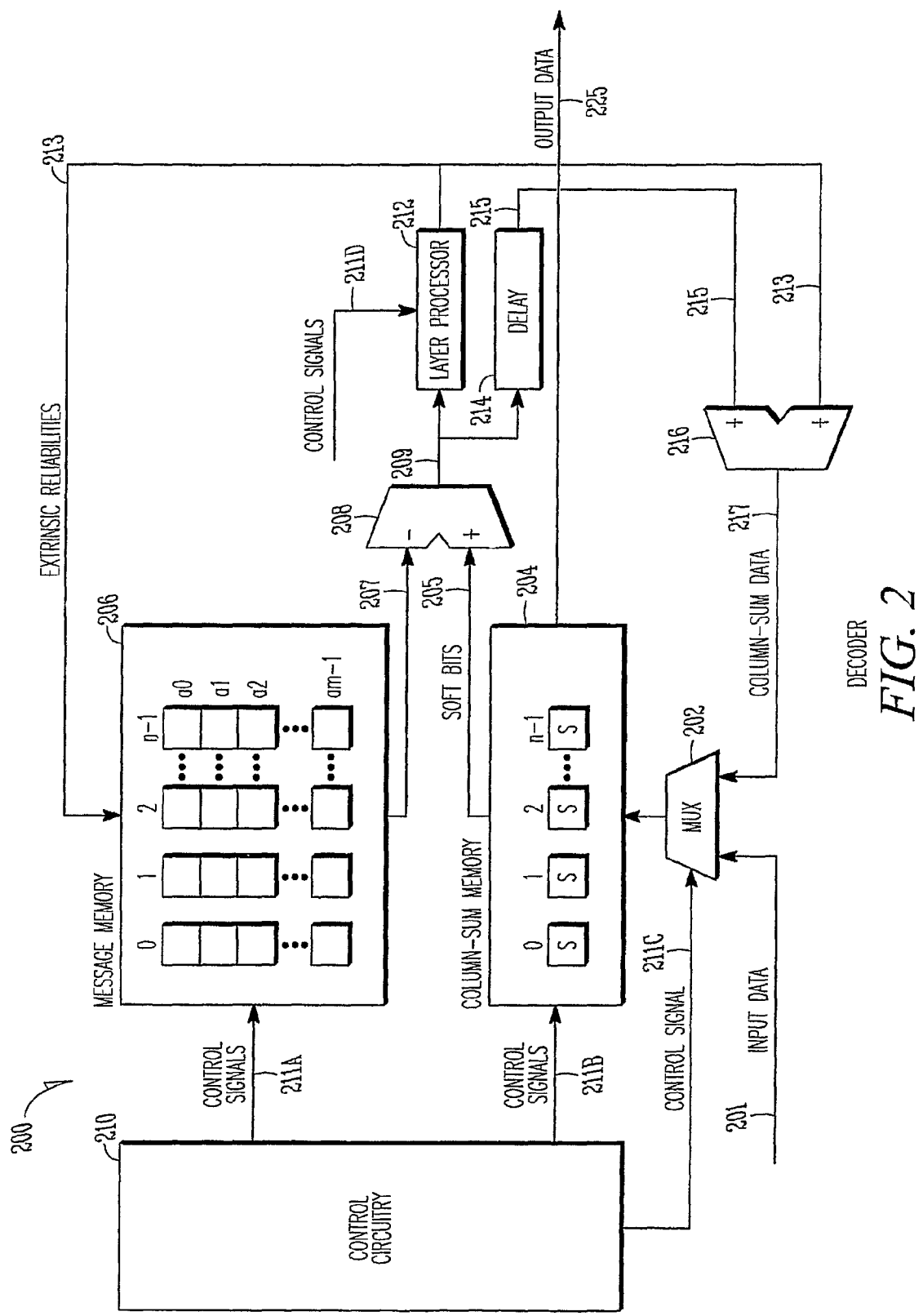
FIG. 2 is an operational diagram of a decoder in accordance with some embodiments of the present invention.

FIG. 2 is an operational diagram of a decoder in accordance with some embodiments of the present invention. Decoder 200 may be suitable for use as decoder 116 (FIG. 1), although other configurations may also be suitable. Decoder 200 may also be suitable for use in other receivers as well as suitable for use in wireline communication devices and data storage systems and devices.

In accordance with some embodiments, decoder 200 includes message memory 206 to store layers of blocks of updated extrinsic reliabilities and column-sum memory 204 to store updated input soft bits, which are referred to as column-sum data. The layers of blocks of updated extrinsic reliabilities stored in message memory 206 may correspond to the layers of a parity check matrix associated with an LDPC code. The blocks shown in message memory 206 and column-sum memory 204 are intended to illustrate blocks of data.

Decoder 200 also includes subtraction element 208 to subtract a layer of updated extrinsic reliabilities 207 from corresponding soft bits of column-sum data 205 from column-sum memory 204. Decoder 200 also includes layer processor 212 to generate updated extrinsic reliabilities 213 from soft bits 209 provided by subtraction element 208. Decoder also includes sum element 216 to add updated extrinsic reliabilities 213 generated by layer processor 212 with soft bits 215 to generate column-sum data 217 for storing in column-sum memory 204.

In some embodiments, decoder 200 may also include multiplexer 202 to initially route input data 201 to column-sum memory 204. Multiplexer (MUX) 202 may subsequently route column-sum data 217 from sum element 216 to column-sum memory 204 after each of a plurality of subiterations. In some embodiments, column-sum data stored in column-sum memory 204 may comprise sums of updated extrinsic reliabilities, corresponding to one column in the parity check matrix that may be currently stored in message memory 206. This data may initially be summed with blocks of input data 201. In some embodiments, input data 201 may comprise input reliabilities, which may be referred to as either soft bits or bit metrics. In some embodiments, input data 201 may correspond to bit metrics 115 (FIG. 1).

In some embodiments, during each subiteration, layer processor 212 may recalculate the data stored in a layer of message memory 206 to update the extrinsic reliabilities of that layer. In some embodiments, for each subiteration, the extrinsic reliabilities in the next layer of message memory 206 may be provided to subtraction element 208, which may subtract the extrinsic reliabilities 207 from soft bits comprising the column-sum data stored in column-sum memory 204 for use by layer processor 212 in generated updated extrinsic reliabilities for that layer.

In some embodiments, for each of the subiterations, layer processor 212 may generate updated extrinsic reliabilities 213 from soft bits 209 provided by subtraction element 208. For each of the subiterations, sum element 216 may add updated extrinsic reliabilities 213 generated by layer processor 212 for a current subiteration with soft bits 215 of prior subiterations provided by subtraction element 208 to generate column-sum data 217 for storage in column-sum memory 204. In some of these embodiments, decoder 200 may also include delay element 214 to provide sum element 216 with soft bits 215 from the prior subiterations received from subtraction element 208 Soft bits 215 may comprise column-sum data from the prior subiterations. This will allow sum element 216 to generate column-sum data for the current subiteration. In some embodiments, delay element 214 may be a delay line, although scope of invention is not limited in this respect.

In some embodiments, after a predetermined number of iterations, some of the data stored in column-sum memory 204 may include a block of output data 225 corresponding to a block of soft bits comprising input data 201. In these embodiments, the block of soft bits comprising input data 201 may have a greater number of bits than the block of output data 225. Each iteration may comprise a number of subiterations which may correspond to the number of layers of the LDPC code. In some embodiments, when a block of input data 201 has a block of n×L soft bits, each block of output data 225 may have (n−m)×L output bits where L is the size of the submatrices of the parity check matrix. The output bits may be hard bits, although scope of invention is not limited in this respect as the output bits may alternatively comprise soft bits. In some embodiments, each block of output data 225 may comprise an output data word. In some embodiments, L may range from 24 to 96, n may be 24 and m may range from 2 to 12, although embodiments of the present invention are equally applicable to lesser and greater values of L, n and m.

In some embodiments, when the number of subiterations equals the number of layers of an LDPC code, the number of layers may correspond to the number of layers (e.g., rows) in message memory 206. For each subiteration, one layer of data may be processed and updated by layer processor 212. The number of total iterations performed to generate each block of output data 225 may depend on code properties and may be predetermined. In some embodiments, number of subiterations may range from two to twenty and the number of iterations may range from about ten to twenty or more, although scope of invention is not limited in this respect.

In some embodiments, decoder 200 may also include control circuitry 210 to generate control signals 211A, 211B, 211C and 211D. Control signals 211C may cause multiplexer 202 to initially route input data 201 to column-sum memory 204 and to subsequently cause multiplexer 202 to route column-sum data 217 from sum element 216 to column-sum memory 204 after each subiteration. Control signals 211A may select a layer of updated extrinsic reliabilities from message memory 206 for each subiteration and may address elements in each block of the selected layer of message memory 206 for subtraction element 208 as well as for the storage of updated extrinsic reliabilities 213 in message memory 206. Control signals 211A may also exclude blocks in message memory 206 corresponding to null submatrices of the parity check matrix from subtraction element 208. Control signals 211B may select column-sum data from column-sum memory 204 for each subiteration for subtraction element 208 and may select a code word as output data 225 from column-sum memory 204 after the predetermined number of iterations.

In some embodiments, the updated extrinsic reliabilities stored in message memory 206 may be initialized to zero for each block of input data 201 received. The updated extrinsic reliabilities stored in message memory 206 may comprise extrinsic messages which are updated once for each subiteration. In these embodiments, for each subiteration, layer processor 212 re-computes the extrinsic reliabilities for one layer of updated extrinsic reliabilities stored in message memory 206 based on one layer of the parity check matrix that the LDPC code is based on. In these embodiments, elements of message memory 206 may be initialized to zero prior to start of a predetermined number of iterations, and may again be initialized to zero after each code word of output data 225 is generated (i.e., after each predetermined number of total iterations).

In some multicarrier and OFDM embodiments, input data 201 may be generated by demodulating a plurality of frequency-domain symbol-modulated subcarriers corresponding to channel-equalized frequency-domain signals 113 (FIG. 1) which may have been generated from a received OFDM signal. In some other embodiments, input data 201 may be generated by demodulating digital modulated signals. The digital modulated signals may have been generated from analog signals that were either down-converted from an antenna input in a wireless system or from an analog channel input in a wired system, although the scope of the invention is not limited in this respect.

Unlike some conventional decoders which use a number of adders based on a parity check matrix, decoder 200 uses two adders (i.e., sum element 216 and subtraction element 208) which may be independent of the parity check matrix. Accordingly, decoder 200 may be suitable for use as a programmable decoder capable of decoding data based on multiple LDPC codes, although the scope of the invention is not limited in this respect. In some embodiments, decoder 200 may use several times less memory than some convention decoders. Furthermore, decoder 200 does not need to perform an additional calculation to determine the output data because the decoding results are stored in column-sum memory 204 after each subiteration as well as after each iteration.

In some of these programmable embodiments, the LDPC code may be defined by control signals 211A through 211D. In these embodiments, control circuitry 210 may generate control signals 211A through 211D from a parity check matrix for a particular LDPC code. In these embodiments, the parity check matrix may be stored in control circuitry 210. In some embodiments, parity check matrix information may be re-written in control circuitry 210 to allow for changing the parity check matrix for different LDPC codes. In these embodiments, control signals 211A may determine the number of layers of the LDPC code and the positions of excluded blocks (i.e., null submatrices in the parity check matrix). Control signals 211A may also address elements in each block for reading/writing, and/or specifying how elements in each block of a layer participate in parity checks. In these embodiments, control signals 211B may address elements in blocks of column-sum memory 204 and may determine the relation of the addresses of extrinsic reliabilities and the updated input reliabilities. In these embodiments, control signals 211B may also determine the size of an output data word. In these embodiments, control signals 211C may determine the size of an input codeword.

Although decoder 200 is illustrated in FIG. 2 as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of decoder 200 may refer to one or more processes operating on one or more processing elements. In some embodiments, the functional elements of decoder 200 may be implemented in one or more field-programmable gate arrays (FPGAs).

Figure 3:
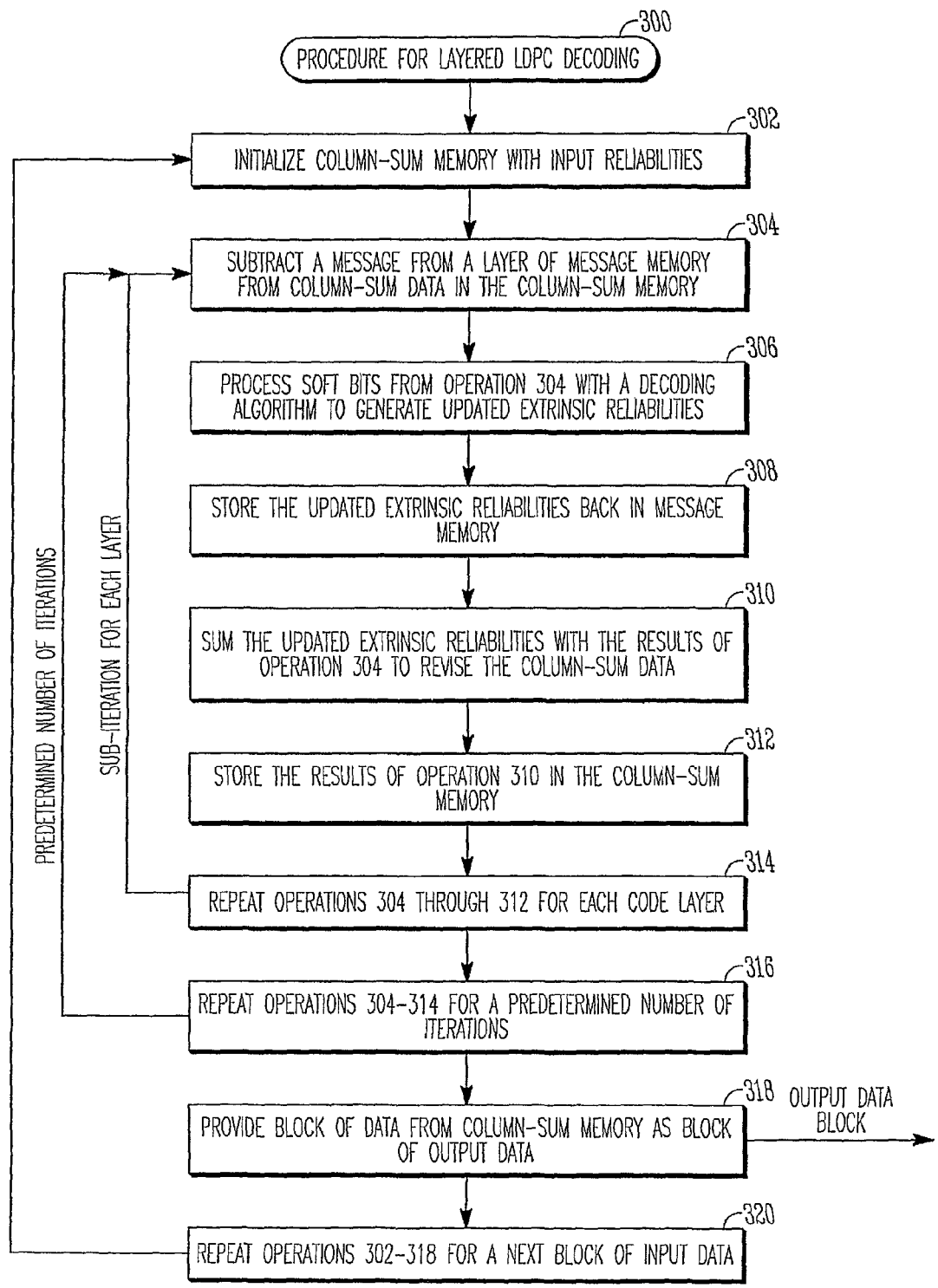
FIG. 3 is a flow chart of a procedure for layered LDPC decoding in accordance with some embodiments of the present invention.

FIG. 3 is a flow chart of a procedure for layered LDPC decoding in accordance with some embodiments of the present invention. Procedure 300 may be performed by a layered LDPC decoder, such as decoder 200 (FIG. 2), although other decoder configurations may also be used to perform procedure 300.

Operation 302 comprises initializing a column-sum memory with input reliabilities. In some embodiments, as part of operation 302, multiplexer 202 (FIG. 2) may initialize column-sum memory 204 (FIG. 2) with a block of soft bits of input data 201 (FIG. 2). In some embodiments, operation 302 may also initialize message memory 206 (FIG. 2) with zeros.

Operation 304 comprises subtracting messages from a layer of a message memory from column-sum data in the column-sum memory. In some embodiments, operation 304 may be performed by subtraction element 208 (FIG. 2) which may subtract a layer of data of message memory 206 (FIG. 2) from the current data in column-sum memory 204 (FIG. 2).

Operation 306 comprises processing soft bits from operation 304 with a decoding algorithm to generate updated extrinsic reliabilities. In some embodiments, operation 306 may be performed by layer processor 212 (FIG. 2) which may operate on the output of subtraction element 208 (FIG. 2). In some embodiments, layer processor 212 (FIG. 2) may perform a decoding algorithm based on one layer of a parity check matrix for an LDPC code, although the scope of the invention is not limited in this respect.

Operation 308 comprises storing the updated extrinsic reliabilities back in the message memory. In some embodiments, the data in a current layer of message memory 206 (FIG. 2) may be replaced with the data generated in operation 306.

Operation 310 comprises summing the extrinsic reliabilities with the results of operation 304 to revise the column-sum data. In some embodiments, operation 310 may be performed by sum element 216 (FIG. 2) and the updated extrinsic reliabilities from the prior iterations may be column-sum data provided by delay element 214 (FIG. 2) so that data generated in operation 310 may comprise the sums of the columns of the data in message memory 206 (FIG. 2).

Operation 312 comprises storing the results of operation 310 in the column-sum memory. In some embodiments, multiplexer 202 (FIG. 2) may be configured to route the output from sum element 216 (FIG. 2) to column-sum memory 204 (FIG. 2).

Operation 314 comprises repeating operations 304 through 312 for each layer of the LDPC code. In some embodiments, operations 304 through 312 may be repeated once for each layer in the message memory (i.e., once for each subiteration).

Operation 316 comprises repeating operations 304 through 314 for a predetermined number of iterations. During operation 316, the extrinsic reliabilities of each layer of message memory 206 (FIG. 2) may be updated each iteration.

Operation 318 comprises providing a block of data from the column-sum memory as a block of output data. In some embodiments, operation 318 may comprise reading the data from column-sum memory 204 (FIG. 2).

Operation 320 comprises repeating operations 302 through 318 for a next block of input data. In this way, a next block of output data may be generated for a next block of input data.

Although the individual operations of procedure 300 are illustrated and described as separate operations, one or more of the individual operations may be performed concurrently, and nothing requires that the operations be performed in the order illustrated.

Figure 4:
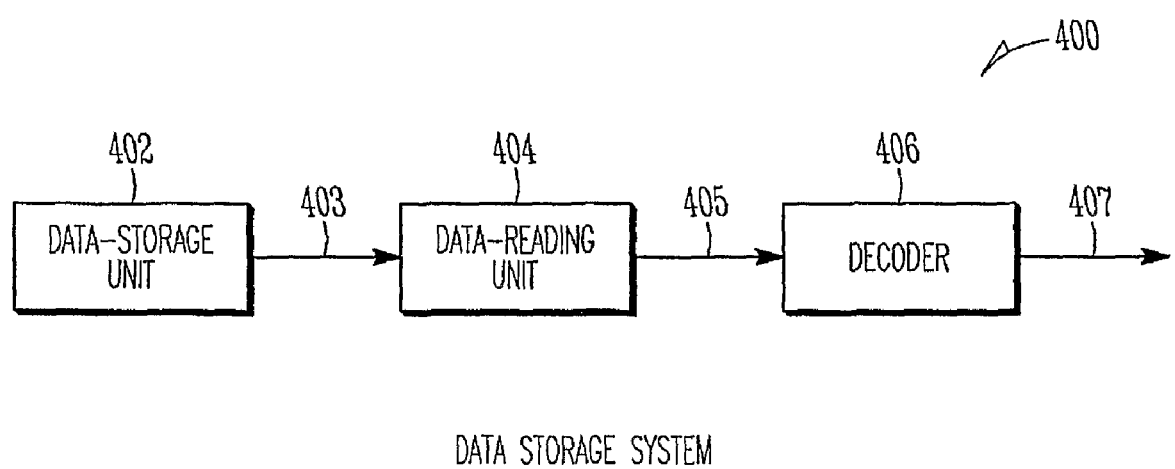
FIG. 4 is a block diagram of a data storage system in accordance with some embodiments of the present invention.

FIG. 4 is a block diagram of a data storage system in accordance with some embodiments of the present invention. Data storage system 400 may include data-storage unit 402 to store data encoded with a layered LDPC code. Data storage system 400 may also include decoder 406 to decode blocks of input data 405 retrieved from data-storage unit 402 to generate blocks of output data 407. In some embodiments, decoder 200 (FIG. 2) may be suitable for use as decoder 406, although other decoder configurations may also be suitable. In some embodiments, data storage system 400 may also include data-reading unit 404 to read blocks of data 403 from data-storage unit 402 and to provide blocks of data 403 to decoder 406 as blocks of input data 405. In some embodiments, blocks of input data 405 may comprise blocks of soft bits, and blocks of output data 407 may be part of a bit stream. Data-storage unit 402 may include almost any machine-readable medium that is capable of storing digital data. In some embodiments, control circuitry 210 (FIG. 2) may generate control signals to instruct data-reading unit 404 to read blocks of data from data-storage unit 402.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

Some embodiments of the invention may be implemented in one or a combination of hardware, firmware and software. Embodiments of the invention may also be implemented as instructions stored on a non-transitory computer-readable storage medium, which may be read and executed by at least one processor to perform the operations described herein. A non-transitory computer-readable storage medium may include any mechanism for storing information in a form readable by a machine (e.g., a computer). For example, a non-transitory computer-readable storage medium may include read-only memory (ROM), random-access memory (RAM), magnetic disk storage media, optical storage media, flash-memory devices, and other non-transitory media.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus, the following claims are hereby incorporated into the detailed description, with each claim standing on its own as a separate preferred embodiment.

What is claimed is:

1. A programmable decoder configurable to decode data encoded with multiple different LDPC codes, the decoder comprising:
    control circuitry programmed with a parity check matrix associated with one of the LDPC codes;
    a message memory to store layers of blocks of updated extrinsic reliabilities;
    a column-sum memory to store soft bits comprising column-sum data;
    a subtraction element to subtract a next layer of the updated extrinsic reliabilities from corresponding soft bits of the column-sum data;
    a layer processor to recalculate data stored in the message memory to update the extrinsic reliabilities of the next layer from a soft-bit output of the subtraction element; and
    a sum element to add the updated extrinsic reliabilities generated by the layer processor with a soft-bit output of a prior subiteration provided by the subtraction element to generate the column-sum data to be fed-back to update the column-sum memory for each iteration,
    wherein the control circuitry is to cause the message memory to exclude blocks of the updated extrinsic reliabilities from being provided to the subtraction element that correspond to null submatrices of the parity check matrix of the programmed LDPC code.

2. The decoder of claim 1 further comprising a multiplexer to initially route input data to the column-sum memory and to subsequently route the column-sum data from the sum element to the column-sum memory after each of a plurality of subiterations,
   wherein the column-sum data comprises sums of updated extrinsic reliabilities in the message memory summed with the input data.

3. The decoder of claim 2 wherein for each of the subiterations, a next layer of the updated extrinsic reliabilities in the message memory is selected, and
   wherein the subtraction element subtracts the updated extrinsic reliabilities of the selected next layer from column-sum data bits stored in the column-sum memory.

4. The decoder of claim 3 wherein for each of the subiterations, the layer processor generates the updated extrinsic reliabilities from soft bits provided by the subtraction element, and
   wherein for each of the subiterations, the sum element adds the updated extrinsic reliabilities generated by the layer processor for a current subiteration with the soft bits of the prior subiterations provided by the subtraction element to generate the column-sum data for storage in the column-sum memory.

5. The decoder of claim 4 further comprising a delay element to provide to the sum element soft bits from the prior subiterations received from the subtraction element to allow the sum element to generate column-sum data for a current subiteration.

6. The decoder of claim 2 wherein the input data comprises blocks of soft bits generated by a demodulator of a multicarrier receiver, and
   wherein the decoder is a low-density parity check (LDPC) decoder that implements layered LDPC decoding.

7. The decoder of claim 6 wherein after a predetermined number of iterations, a block of output data corresponding to a block of soft bits comprising the input data is stored in the column-sum memory, the block of soft bits comprising the input data having a greater number of bits than the block of output data, and
   wherein each iteration comprises a plurality of the subiterations.

8. The decoder of claim 2 wherein the control circuitry is configured to generate control signals to:
   cause the multiplexer to initially route the input data to the column-sum memory and to subsequently route the column-sum data from the sum element to the column-sum memory after each subiteration;
   select a layer of updated extrinsic reliabilities from the message memory for each of subiteration for the subtraction element;
   select column-sum data from the column-sum memory for each of the subiterations for the subtraction element;
   select a code word as output data from the column-sum memory after a predetermined number of iterations.

9. The decoder of claim 1 wherein the updated extrinsic reliabilities stored in message memory are initialized to zero and comprise extrinsic messages which are updated once for each of the subiterations,
   wherein for each subiteration, the layer processor re-computes extrinsic reliabilities based on one row of a parity check matrix.

10. The decoder of claim 1 wherein input data for the decoder is generated by demodulating a plurality of frequency-domain symbol-modulated subcarriers generated from a received orthogonal frequency division multiplexed (OFDM) signal.

11. A method of decoding blocks of soft bits with a programmable decoder configurable to decode data encoded with multiple different LDPC code, the method comprising:
   programming control circuitry with a parity check matrix associated with one of the LDPC codes;
   configuring a message memory to store layers of blocks of updated extrinsic reliabilities;
   initializing a column-sum memory with input data;
   updating the column-sum memory with sums of updated extrinsic reliabilities generated by processing differences between current data in the memory and the updated extrinsic reliabilities;
   reading decoded output data from the memory after a predetermined number of iterations; and
   causing the message memory to exclude blocks of the updated extrinsic reliabilities from being subtracted that correspond to null submatrices of the parity check matrix of the pro rammed LDPC code.

12. The method of claim 11
   wherein the method further comprises:
   subtracting a layer of the updated extrinsic reliabilities from corresponding soft bits of the column-sum data;
   generating the updated extrinsic reliabilities from soft bits provided by the subtracting; and
   adding the updated extrinsic reliabilities to soft bits of prior subiterations provided by subtracting to generate the column-sum data to generate the soft bits comprising column-sum data for storing in the column-sum memory.

13. The method of claim 12 further comprising:
   initially routing the input data to the column-sum memory; and
   subsequently routing the column-sum data from the sum element to the column-sum memory after each of a plurality of subiterations,
   wherein the column-sum data comprises sums of updated extrinsic reliabilities in the message memory summed with the input data.

14. The method of claim 13 wherein for each of the subiterations, the method further comprises:
   selecting a next layer of the updated extrinsic reliabilities in the message memory; and
   subtracting the updated extrinsic reliabilities of the selected next layer from column-sum data bits stored in the column-sum memory.

15. The method of claim 14 wherein for each of the subiterations, the method further comprises:
   generating the updated extrinsic reliabilities from soft bits provided by the subtraction element; and
   adding the updated extrinsic reliabilities generated for a current subiteration with the soft bits of the prior subiterations to generate the column-sum data for storing in the column-sum memory.

16. The method of claim 15 further comprising providing soft bits from the prior subiterations to allow the generation of column-sum data for a current subiteration.

17. The method of claim 13 wherein the input data comprises blocks of soft bits generated by demodulating a multicarrier receiver, and
   wherein the input data is encoded with a low-density parity check (LDPC) code.

18. The method of claim 17 wherein after a predetermined number of iterations, a block of output data corresponding to a block of soft bits comprising the input data is stored in the column-sum memory, the block of soft bits comprising the input data having a greater number of bits than the block of output data, and wherein each iteration comprises a plurality of the subiterations.

19. The method of claim 13 further comprising generating control signals to:
   initially route the input data to the column-sum memory;
   subsequently route the column-sum data from the sum element to the column-sum memory after each subiteration;
   select a layer of updated extrinsic reliabilities from the message memory for each of subiteration for the subtracting;
   select column-sum data from the column-sum memory for each of the subiterations for the subtracting;
   select a code word as output data from the column-sum memory after a predetermined number of iterations.

20. The method of claim 12 further comprising initializing any updated extrinsic reliabilities stored in message memory, wherein the updated extrinsic reliabilities comprise extrinsic messages that are updated once for each of the subiterations,
   wherein for each subiteration, the method comprises re-computing extrinsic reliabilities based on one row of a parity check matrix.

21. The method of claim 11 wherein the input data is generated by demodulating a plurality of frequency-domain symbol-modulated subcarriers generated from a received orthogonal frequency division multiplexed (OFDM) signal.

22. A data storage system comprising:
   a data-storage unit to store data encoded with multiple different a layered low-density parity check (LDPC) codes; and
   a programmable decoder to decode blocks of input data retrieved from the data-storage unit and to generate blocks of output data, the decoder comprising control circuitry programmed with a parity check matrix associated with one of the LDPC codes, a message memory to store layers of blocks of updated extrinsic reliabilities, a column-sum memory to store soft bits comprising column-sum data, a subtraction element to subtract a next layer of the updated extrinsic reliabilities from corresponding soft bits of the column-sum data, a layer processor to recalculate data stored in the message memory to update the extrinsic reliabilities of the next layer from a soft-bit output of the subtraction element, and a sum element to add the updated extrinsic reliabilities generated by the layer processor with a soft-bit output of a prior subiteration provided by the subtraction element to generate the column-sum data to be fed-back to update the column-sum memory for each iteration,
   wherein the control circuitry is to cause the message memory to exclude blocks of the updated extrinsic reliabilities from being provided to the subtraction element that correspond to null submatrices of the parity check matrix of the programmed LDPC code.

23. The data storage system of claim 22 wherein after a predetermined number of iterations, a block of output data corresponding to a block of soft bits comprising the input data is stored in the column-sum memory.

24. The data storage system of claim 23 further comprising a data-reading unit to read the blocks of the input data from the data-storage element, and
   wherein the decoder further comprises:
      multiplexer to initially route the input data to the column-sum memory and to subsequently route the column-sum data from the sum element to the column-sum memory after each of a plurality of subiterations,
   wherein the column-sum data comprises sums of updated extrinsic reliabilities in the message memory summed with the input data.

25. The data storage system of claim 24 wherein for each of the subiterations, a next layer of the updated extrinsic reliabilities in the message memory is selected, and
   wherein the subtraction element subtracts the updated extrinsic reliabilities of the selected next layer from column-sum data bits stored in the column-sum memory.

26. A multicarrier receiver comprising:
   a demodulator to generate soft bits by demodulating subcarriers of multicarrier communication signals; and
   a programmable decoder configurable to decode data encoded with multiple different LDPC codes, the decoder comprising:
      control circuitry programmed with a parity check matrix associated with one of the LDPC codes;
      a message memory to store layers of blocks of updated extrinsic reliabilities;
      a column-sum memory to store soft bits comprising column-sum data;
      a subtraction element to subtract a next layer of the updated extrinsic reliabilities from corresponding soft bits of the column-sum data;
      a layer processor to recalculate data stored in the message memory to update the extrinsic reliabilities of the next layer from a soft-bit output of the subtraction element; and
      a sum element to add the updated extrinsic reliabilities generated by the layer processor with a soft-bit output of a prior subiteration provided by the subtraction element to generate the column-sum data to be fed-back to update the column-sum memory for each iteration,
   wherein the control circuitry is to cause the message memory to exclude blocks of the updated extrinsic reliabilities from being provided to the subtraction element that correspond to null submatrices of the parity check matrix of the programmed LDPC code.

27. The multicarrier receiver of claim 26 wherein the decoder further comprises:
   a multiplexer to initially route input data comprising soft bits provided by the demodulator to the column-sum memory and to subsequently route the column-sum data from the sum element to the column-sum memory after each of a plurality of subiterations,
   wherein the column-sum data comprises sums of updated extrinsic reliabilities in the message memory summed with the input data, and
   wherein after a predetermined number of iterations, a block of output data corresponding to a block of the soft bits comprising the input data is stored in the column-sum memory.

28. The multicarrier receiver of claim 27 wherein for each of the subiterations, a next layer of the updated extrinsic reliabilities in the message memory is selected, and
   wherein the subtraction element subtracts the updated extrinsic reliabilities of the selected next layer from column-sum data bits stored in the column-sum memory.

29. A non-transitory computer-readable storage medium that provides instructions, which when accessed, cause one or more processors to perform operations for decoding data encoded with multiple different LDPC codes, the operations comprising:
   programming control circuit with a parity check matrix associated with one of the LDPC codes;
   configuring a message memory to store layers of blocks of updated extrinsic reliabilities;

initializing a column-sum memory with input data;

updating the column-sum memory with sums of updated extrinsic reliabilities generated by processing differences between current data in the memory and the updated extrinsic reliabilities;

reading decoded output data from the memory after a predetermined number of iterations; and causing the message memory to exclude blocks of the updated extrinsic reliabilities from being subtracted that correspond to null submatrices of the parity check matrix of the programmed LDPC code.

30. The non-transitory computer-readable storage medium of claim 29 wherein the memory comprises a column-sum memory, and wherein the instructions, when further accessed, cause the machine to:

store layers of blocks of updated extrinsic reliabilities in a message memory;

subtract a layer of the updated extrinsic reliabilities from corresponding soft bits of the column-sum data;

generate the updated extrinsic reliabilities from soft bits provided by the subtracting; and add the updated extrinsic reliabilities to soft bits of prior subiterations provided by subtracting to generate the column-sum data to generate the soft bits comprising column-sum data for storing in the column-sum memory.

31. The non-transitory computer-readable storage medium of claim 30 wherein the instructions, when further accessed, cause the machine to:

initially route the input data to the column-sum memory; and subsequently route the column-sum data from the sum element to the column-sum memory after each of a plurality of subiterations, wherein the column-sum data comprises sums of updated extrinsic reliabilities in the message memory summed with the input data.

* * * * *

UNITED STATES PATENT AND TRADEMARK OFFICE
CERTIFICATE OF CORRECTION

PATENT NO. : 8,234,537 B2
APPLICATION NO. : 12/282239
DATED : July 31, 2012
INVENTOR(S) : Pavlov et al.

Page 1 of 1

It is certified that error appears in the above-identified patent and that said Letters Patent is hereby corrected as shown below:

On the title page, in field (73), in "Assignee", in column 1, line 1, delete "CO" and insert --CA--, therefor On the title page, in column 2, under "Other Publications", line 1, delete "rt" and insert --et--, therefor On the title page, in column 2, under "Other Publications", line 1, before "High", insert --"--, therefor On the title page, in column 2, under "Other Publications", line 1, after "Decoders,", insert --"--, therefor On the title page, in column 2, under "Other Publications", line 3, delete "E," and insert --E.,--, therefor On page 2, in column 1, under "Other Publications", line 3, delete "E," and insert --E.,--, therefor On page 2, in column 2, under "Other Publications", line 1, Delete "2008-7024005 ," and insert --2008-7024005,--, therefor In column 11, line 53, in claim 8, after "element;", insert --and--, therefor In column 12, line 18, in claim 11, delete "pro rammed" and insert --programmed--, therefor In column 13, line 14, in claim 19, after "subtracting;", insert --and--, therefor In column 14, line 16, in claim 26, delete "circuity" and insert --circuitry--, therefor In column 14, line 64, in claim 29, delete "circuit" and insert --circuitry--, therefor Signed and Sealed this
Fourth Day of December, 2012

David J. Kappos
*Director of the United States Patent and Trademark Office*